United States Patent
Morita et al.

(10) Patent No.: US 7,916,504 B2
(45) Date of Patent: Mar. 29, 2011

(54) VOLTAGE DETECTION DEVICE AND VOLTAGE DETECTION METHOD

(75) Inventors: Tsuyoshi Morita, Zama (JP); Hayato Nagakura, Hadano (JP); Shinsuke Yoshida, Atsugi (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 355 days.

(21) Appl. No.: 12/160,642

(22) PCT Filed: Jan. 12, 2007

(86) PCT No.: PCT/JP2007/050324
§ 371 (c)(1),
(2), (4) Date: Jul. 11, 2008

(87) PCT Pub. No.: WO2007/080967
PCT Pub. Date: Jul. 19, 2007

(65) Prior Publication Data
US 2009/0190376 A1   Jul. 30, 2009

(30) Foreign Application Priority Data

Jan. 12, 2006  (JP) ................................ 2006-004834
Dec. 14, 2006  (JP) ................................ 2006-336985

(51) Int. Cl.
*H02M 3/335* (2006.01)
*H02M 3/24* (2006.01)

(52) U.S. Cl. .................... 363/20; 363/21.01; 363/21.04; 363/131; 363/97

(58) Field of Classification Search .................... 363/20, 363/21.01, 21.04, 21.09, 131, 95, 97, 55
See application file for complete search history.

(56) References Cited

U.S. PATENT DOCUMENTS

| | | | | |
|---|---|---|---|---|
| 5,278,490 A | * | 1/1994 | Smedley | 323/284 |
| 5,398,181 A | * | 3/1995 | Yeh | 363/95 |
| 5,412,557 A | * | 5/1995 | Lauw | 363/37 |
| 5,513,089 A | * | 4/1996 | Sudo et al. | 363/21.11 |
| 6,181,120 B1 | * | 1/2001 | Hawkes et al. | 323/282 |
| 6,292,717 B1 | | 9/2001 | Alexander et al. | |

(Continued)

FOREIGN PATENT DOCUMENTS

JP          05-249128 A        9/1993

(Continued)

OTHER PUBLICATIONS

U.S. Appl. No. 12/160,645, filed Jul. 11, 2008, Morita et al.

(Continued)

*Primary Examiner* — Bao Q Vu
(74) *Attorney, Agent, or Firm* — Foley & Lardner LLP

(57) ABSTRACT

A voltage detection device that is connected to a DC circuit to which a DC voltage is applied and that detects the DC voltage applied to the DC circuit includes a voltage conversion unit for outputting a first voltage that increases as the DC voltage increases and a second voltage that decreases as the DC voltage increases, an error detection unit for detecting an error for the first voltage and the second voltage based upon the first voltage and the second voltage when the DC voltage is 0, and a voltage calculation unit for correcting a difference between the first voltage and the second voltage based upon the error detected by the error detection unit and calculating the DC voltage based upon the corrected difference between the first voltage and the second voltage.

14 Claims, 13 Drawing Sheets

U.S. PATENT DOCUMENTS

| | | |
|---|---|---|
| 6,489,786 B1 | 12/2002 | Takemoto et al. |
| RE38,780 E * | 8/2005 | Hawkes et al. ............... 323/282 |
| RE38,906 E * | 12/2005 | Hawkes et al. ............... 323/282 |
| RE38,940 E * | 1/2006 | Isham et al. .................. 323/224 |
| 7,327,129 B2 | 2/2008 | Chen et al. |
| 2003/0214820 A1 * | 11/2003 | Nakata ....................... 363/21.01 |
| 2005/0231175 A1 | 10/2005 | Furukawa et al. |

FOREIGN PATENT DOCUMENTS

| | | |
|---|---|---|
| JP | 06-117872 A | 4/1994 |
| JP | 07-255169 A | 10/1995 |
| JP | 08-006649 A | 1/1996 |
| JP | 09-074751 A | 3/1997 |
| JP | 11-264843 A | 9/1999 |
| JP | 2000-162249 A | 6/2000 |
| JP | 2001-124805 A | 5/2001 |
| JP | 2005-181021 A | 7/2005 |
| JP | 2005-315853 A | 11/2005 |
| JP | 2006-003156 A | 1/2006 |

OTHER PUBLICATIONS

Tsuyoshi Morita et al., USPTO Notice of Allowance, U.S. Appl. No. 12/160,645, filed Jun. 1, 2010, 9 pages.

* cited by examiner (a) TRIGGER SIGNAL (b) OUTPUT WAVEFORM

VOLTAGE DETECTION OUTPUT STAGE POTENTIAL (V)

V: DETECTED VOLTAGE VALUE
V1: INCREASED VOLTAGE OUTPUT
V2: DECREASED VOLTAGE OUTPUT
Va: OFFSET ERROR $Vta = V1 - V2 - Va$

VOLTAGE DETECTION DEVICE AND VOLTAGE DETECTION METHOD

TECHNICAL FIELD

The present invention relates to a device that detects a DC output voltage outputted from a battery or a capacitor or the like.

BACKGROUND ART

In the prior art, in a vehicle such as, for example, an electric automobile or a HEV (Hybrid Electric Vehicle) or the like that includes an electric motor driven by electrical power outputted from a battery, and that is propelled by the driving force of the electric motor, various kinds of methods have been used for detecting the DC voltage that is applied from the battery to the circuitry (hereinafter this will also be termed the "output voltage of the battery"), that is a voltage to be the subject for detection. For example, it is known to provide a voltage sensor of a non-insulated type that is adapted to be able accurately to detect this output voltage, even at a position remote from the battery, by a current that corresponds to the output voltage of the battery being flowed through a cable (refer to Patent Document #1).

Patent Document #1: Japanese Laid-Open Patent Publication 2001-124805.

DISCLOSURE OF THE INVENTION

Problems to be Solved by the Invention

With the voltage sensor disclosed in Patent Document #1 (hereinafter this is also termed a "voltage detection device"), it is necessary to make the dynamic range of the current that flows through the cable large, in order to alleviate the influence of noise and of quantization errors during A/D conversion and the like and thus to enhance the accuracy of detection. However, if the dynamic range of the current that flows through the cable is made large, then the problem arises that, due to losses in the cable corresponding thereto, this causes useless consumption of electrical power.

In order to solve this problem, it has been considered to provide a voltage sensor including a voltage conversion circuit that outputs a first voltage that increases as the DC voltage that is to be the subject of detection increases and a second voltage that decreases as the DC voltage that is to be subject of detection increases, and that calculates the DC voltage that is the subject for detection, based upon the difference between the first voltage and the second voltage that are outputted from this voltage conversion circuit. However, since the circuitry becomes more complicated as compared to a prior art voltage sensor if this type of voltage sensor is used, accordingly the influence upon the circuitry due to environmental conditions such as changes of temperature and the like becomes large along with this complication of the circuitry, and this entails the problem that it becomes easy for error in the detected voltage (the offset error by which the detected voltage value is offset) to occur. Thus, there is a requirement for detection of the DC voltage at high accuracy.

Means for Solving the Problems

According to a first aspect of the present invention, a voltage detection device is connected to a DC circuit to which a DC voltage is applied and detects the DC voltage applied to the DC circuit. This voltage detection device comprises a voltage conversion means for outputting a first voltage that increases as the DC voltage increases and a second voltage that decreases as the DC voltage increases, an error detection means for detecting an error for the first voltage and the second voltage based upon the first voltage and the second voltage when the DC voltage is 0, and a voltage calculation means for correcting a difference between the first voltage and the second voltage outputted by the voltage conversion means based upon the error detected by the error detection means and calculating the DC voltage based upon the corrected difference between the first voltage and the second voltage.

According to a second aspect of the present invention, a voltage detection device is connected to a DC circuit to which a DC voltage is applied and detects the DC voltage applied to the DC circuit. This voltage detection device comprises a voltage conversion means for outputting a first voltage that increases as the DC voltage increases and a second voltage that decreases as the output voltage increases, a voltage calculation means for calculating the DC voltage based upon a difference between the first voltage and the second voltage outputted by the voltage conversion means, and a failure judgment means for judging failure based upon at least one of the first voltage and the second voltage when the DC voltage is zero.

According to a third aspect of the present invention, a voltage detection method for detecting a DC voltage that is applied to a DC circuit comprises outputting a first voltage that increases as the DC voltage increases and a second voltage that decreases as the DC voltage increases, detecting an error for the first voltage and the second voltage based upon the first voltage and the second voltage when the DC voltage is 0, correcting a difference between the first voltage and the second voltage based upon the detected error, and calculating the DC voltage based upon the corrected difference between the first voltage and the second voltage.

According to a fourth aspect of the present invention, a voltage detection method for detecting a DC voltage that is applied to a DC circuit comprises outputting a first voltage that increases as the DC voltage increases and a second voltage that decreases as the DC voltage increases, calculating the DC voltage based upon a difference between the first outputted voltage and the second outputted voltage, and judging failure based upon at least one of the first voltage and the second voltage when the DC voltage is zero.

ADVANTAGEOUS EFFECT OF THE INVENTION

According to the present invention, it is possible to detect a DC voltage at high accuracy.

BEST MODE FOR CARRYING OUT THE INVENTION

Embodiment 1

Figure 1:
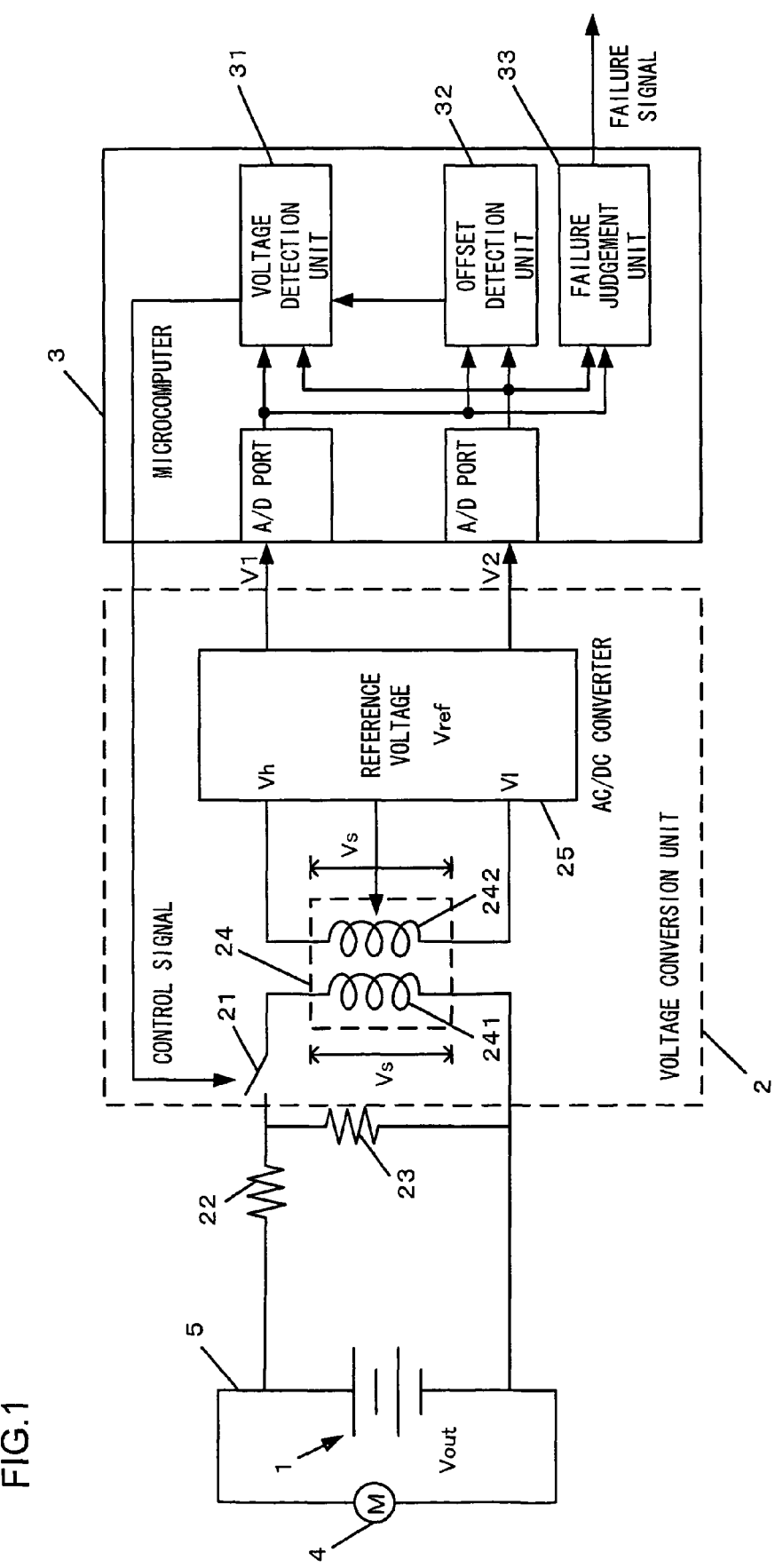
FIG. 1 is a block diagram of a voltage detection device for a vehicle according to a first embodiment.

FIG. 1 is a block diagram of a voltage detection device for a vehicle according to an embodiment to which the present invention has been applied. This voltage detection device is mounted to a vehicle or the like that is equipped with an electric motor 4 driven by electrical power supplied from a battery 1, and that is propelled by the drive force of the electric motor 4. The vehicle to which this voltage detection device is mounted may be, for example, an electric automobile or a hybrid automobile (HEV) or the like. As shown in FIG. 1, this voltage detection device is connected to a DC circuit 5 to which the output voltage of the battery 1 (a DC voltage) is applied, and detects the output voltage of the battery 1. This voltage detection device includes a voltage conversion unit 2 and a microcomputer 3.

A switch 21, a transformer 24, and an AC/DC converter 25 are included in the voltage conversion unit 2. The transformer 24 includes a primary coil 241 on the side of the battery 1, that is its input stage, and a secondary coil 242 on the side of the AC/DC converter 25, that is its output stage. It should be understood that the primary coil 241 and the secondary coil 242 are electrically insulated from one another. Moreover, since the output voltage of the battery 1 is a high voltage, resistors 22 and 23, that are voltage division resistors, are provided for inputting to the voltage detection device a voltage that has been voltage divided and thus lowered. It would also be acceptable not to provide the resistors 22 and 23, provided that the output voltage of the battery 1 is less than or equal to the withstand voltage of the voltage detection device.

The DC output voltage Vout that is outputted from the battery 1 is reduced by the resistors 22 and 23 (hereinafter termed the "voltage division resistors"), and is inputted to the voltage conversion unit 2 as a DC input voltage. And the voltage conversion unit 2 outputs to the microcomputer 3 DC voltages V1 and V2 based upon the voltage that has been inputted (hereinafter simply termed the "input voltage"). The microcomputer 3 detects these DC voltages V1 and V2 outputted from the voltage conversion unit 2, and obtains the output voltage Vout of the battery 1 based upon the results of this detection. With the voltage detection device shown in FIG. 1, detection of the battery output voltage is performed in this manner. In the following, the details of the operation of the voltage conversion unit 2 and the microcomputer 3 will be explained in concrete terms.

The switch 21 of the voltage conversion unit 2 operates to open and close according to a control signal from the microcomputer 3. By the opening and closing operation of this switch 21, the connection state of the battery 1 and the primary coil 241 is changed over between connected and disconnected. By repeating the opening and closing operation of this switch 21 at a predetermined period, and thereby changing over the connection state of the battery 1, the input voltage oscillates at the predetermined period corresponding to the operation of the switch 21. When this happens, the input voltage is converted from a DC voltage to an AC voltage, and the AC voltage, that corresponds to the magnitude of the input voltage, is applied to the primary coil 241 of the transformer 24. In other word, the switch 21 functions as a DC/AC conversion means that converts the input DC voltage to an AC voltage, due to the fact that its opening and closing operation is repeated at the predetermined period. An AC electrical current flows in the primary coil 241 due to this AC voltage that is applied. The potential difference that is generated between the two ends of the primary coil 241 at this time will be denoted by Vs.

This potential difference Vs between the two ends of the primary coil 241 changes cyclically over time according to the opening and closing operation of the switch 21. If the effective value of Vs at this time is denoted by Vsef, then the ratio between the output voltage Vout of the battery 1 and Vsef is determined according to the ratios of the impedances of the resistors 22 and 23 and the primary coil 241.

The impedances of the resistors 22 and 23 are determined from their respective resistance values. And the impedance of the primary coil 241 is determined according to the frequency of the voltage that is applied to the primary coil 241, in other words according to the operating frequency of the switch 21, and according to the inductance of the primary coil 241. Thus, when the switch 21 is operated at a predetermined operating frequency, the ratios of the impedances of the resistor 22, the resistor 23, and the primary coil 241 is fixed. In other words, the ratio between Vout and Vsef may be determined and set in advance according to the values of the resistances of the resistor 22 and the resistor 23, the inductance of the primary coil 241, and the operating frequency of the switch 21.

Figure 2:
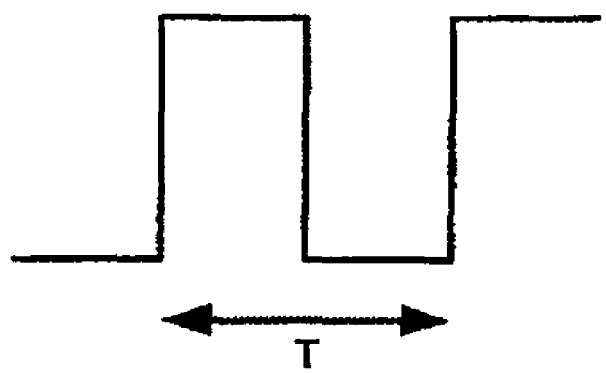
FIG. 2($a$) is a figure showing a trigger signal that is inputted to a switch, and FIG. 2($b$) is a figure showing a relationship between the battery output voltage Vout and the effective value Vsef of the electrical potential difference between the two ends of a primary coil.
Figure 2:
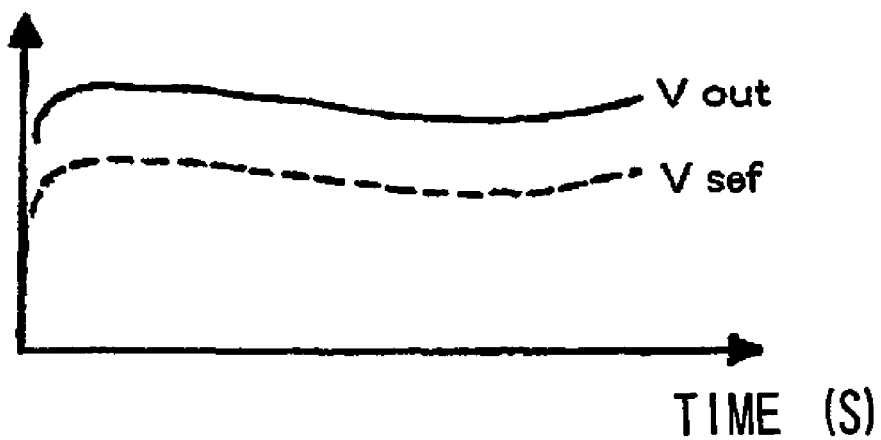

The graph of FIG. 2(*a*) shows an example of a trigger signal that is inputted as a control signal to the switch 21 from the microcomputer 3. And the graph of FIG. 2(*b*) shows the relationship between the output voltage Vout of the battery 1 and the effective value Vsef of the potential difference between the two ends of the primary coil 241. For example, as shown in FIG. 2(*a*), a trigger signal of the period T is inputted to the switch 21, and the switch 21 is opened and closed according thereto. At this time, by setting the period T sufficiently small with respect to the time over which the output voltage Vout of the battery 1 changes due to fluctuations of the electrical power consumed by the electric motor 4 and the like, and by thus operating the switch 21 at high speed, it is possible, as shown in FIG. 2(*b*), to recreate faithfully with Vsef the way in which the output voltage Vout changes.

The AC voltage that is applied to the primary coil 241 is transmitted from the primary coil 241, that is the input stage of the transformer 24, to the secondary coil 242 that is its output stage. Here, if the ratio between the number of turns of the primary coil 241 and the secondary coil 242 is 1, then the magnitude of the AC voltage that is applied to the primary coil 241 and the magnitude of the AC voltage that is transmitted to the secondary coil 242 are approximately equal to one another. Accordingly, the potential difference generated between the two ends of the secondary coil 242 may also be denoted by the same symbol Vs as in the case of the primary coil 241.

It should be understood that, in the transformer 24, it is desirable for the temperature characteristics of the primary coil 241 and the secondary coil 242 to be the same. If this is the case, then it is possible to make the magnitude of the AC voltage that is applied to the primary coil 241 and the magnitude of the AC voltage that is transmitted to the secondary coil 242 be approximately equal, even if temperature change takes place.

If the value of the resistance of the resistor 22 is 0, then all of the voltage Vout, that has been converted from a DC voltage to an AC voltage as described above, is transmitted from the primary coil 241 to the secondary coil. On the other hand, if the value of the resistance of the resistor 22 is not 0, then a portion of the voltage Vout that has been converted to an AC voltage is inputted to the primary coil 241 and is transmitted to the secondary coil 242. As previously described, the transmission ratio at this time is determined by the resistance values of the resistor 22 and the resistor 23, the inductance of the primary coil 241, and the operating frequency of the switch 21.

A predetermined reference voltage Vref that is outputted from the AC/DC converter 25 is applied to the point of the secondary coil 242 where its impedance becomes half, in other words to the point that is positioned at the approximate center of the secondary coil 242. Due to this, if the voltages that are generated at the two ends of the secondary coil 242 are denoted by Vh and Vl, then these can be expressed as in Equations (1) and (2) below, using the potential difference Vs between the two ends of the secondary coil 242. It should be understood that Vh is the + side (the side at high electrical potential), while Vl is the − side (the side at low electrical potential). Since the potential difference Vs between the two ends of the coil changes over time at the predetermined period according to the operation of the switch 21 as described above, accordingly both Vh and Vl are AC voltages that change around the reference voltage Vref as a center.

$$Vh = Vref + (½)Vs \quad (1)$$

$$Vl = Vref - (½)Vs \quad (2)$$

The AC voltages Vh and Vl defined by the above Equations (1) and (2) are inputted to the AC/DC converter 25. The AC/DC converter 25 obtains the effective values of the AC voltages Vh and Vl that have been inputted, converts them respectively to DC voltages V1 and V2 based upon Equations (3) and (4) below, and inputs these to A/D ports of the microcomputer 3. The microcomputer 3 converts the DC voltages V1 and V2 that have been inputted to its A/D ports from analog signals to digital signals, thus inputting them as digital values. Due to this, the DC voltages V1 and V2 are detected by the microcomputer 3.

By replacing Vs in the above Equations (1) and (2) above with the effective value Vsef, these DC voltages V1 and V2 outputted by the AC/DC converter 25 may be obtained as shown in Equations (3) and (4) below:

$$V1 = Vref + (½)Vsef \quad (3)$$

$$V2 = Vref - (½)Vsef \quad (4)$$

Here, as previously described, the ratio between Vout and Vsef is determined in advance according to the resistance values of the resistor 22 and the resistor 23, the inductance of the primary coil 241, and the operating frequency of the switch 21. If this ratio is termed the transmission ratio Rt, then Equations (3) and (4) may be rewritten as the following Equations (5) and (6):

$$V1 = Vref + (½)Rt \cdot Vout \quad (5)$$

$$V2 = Vref - (½)Rt \cdot Vout \quad (6)$$

From Equations (5) and (6), the following Equation (7) is derived:

$$Vout = (1/Rt) \cdot (V1 - V2)$$

Putting V1−V2=V, this becomes $$Vout = V/Rt \quad (7)$$

The microcomputer 3 includes a voltage detection unit 31, an offset voltage detection unit 32, and a failure judgment unit 33. The voltage detection unit 31 inputs the DC voltages V1 and V2 as the digital signals outputted from the A/D ports, and obtains the output voltage Vout of the battery 1 based upon these DC voltages V1 and V2 that have been inputted. The offset voltage detection unit 32 detects an offset voltage that will be described hereinafter based upon the DC voltages V1 and V2 that have been inputted. And the failure judgment unit 33 makes a judgment as to failure of the voltage detection device based upon the DC voltages V1 and V2 that have been inputted.

Figure 3:
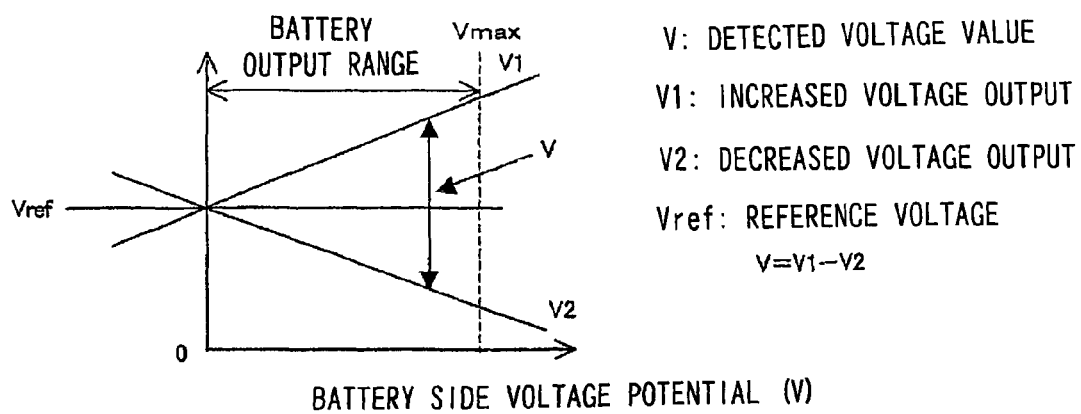
FIG. 3 is a figure showing a relationship between the battery output voltage Vout and DC voltages V1 and V2.

The graph of FIG. 3 shows the relationship between the magnitude of the output voltage of the battery 1 and the DC voltages V1 and V2 given by Equations (5) and (6). The horizontal axis shows the battery side voltage potential, in other words the magnitude of the output voltage Vout, while the vertical axis shows the voltage detection output stage potential, in other words the magnitudes of the DC voltages V1 and V2. As shown in the graph of FIG. 3, the DC voltages V1 and V2 change in accordance with the output voltage Vout. V1 increases along with increase of Vout, whereas, symmetrically, V2 decreases along with increase of Vout. It should be understood that both V1 and V2 become equal to the reference voltage Vref when Vout=0.

The voltage detection unit 31 obtains the output voltage Vout of the battery 1 from Equation (7) described above, based upon the DC voltages V1 and V2 that are inputted and the predetermined transmission ratio Rt that has been determined in advance. In other words, the voltage detection unit 31 calculates the difference V between V1 and V2 shown in FIG. 3, and obtains the output voltage Vout of the battery 1 by applying this differential V between V1 and V2 that has been calculated to Equation (7) described above. By obtaining the output voltage Vout of the battery 1 in this manner, it is possible to perform voltage detection at high accuracy without engendering useless electrical power consumption, such as when flowing an electrical current through a cable.

It should be understood that the A/D ports of the microcomputer 3 have a predetermined voltage detection range that is determined in advance (this is the range over which they can perform detection, for example from 0 V to 5 V). Accordingly, V1 and V2 are outputted from the voltage conversion unit 2 within this voltage detection range. As shown in FIG. 3, if the maximum output voltage of the battery 1 is Vmax, then the range of Vout is from 0 to Vmax. The reference voltage Vref and the transmission ratio Rt are determined so that the V1 and V2 that are outputted for this Vout always lie within the voltage detection range of the A/D ports of the microcomputer 3. For example, if the range over which the A/D ports of the microcomputer 3 can perform detection is 0 V to 5 V, then Vref may be set to 2.5 V, and also the transmission ratio Rt is set so that, when the output voltage of the battery 1 is at its maximum Vmax, V1 is less than or equal to 5 V and V2 is greater than or equal to 0 V. By doing this, it is possible for V1 and V2 to be detected by the microcomputer 3.

In the transformer 24, the primary coil 241 and the secondary coil 242 are insulated from one another. Due to this, Vout is electrically insulated from V1 and V2, so that output voltage is not directly transmitted from the battery 1. Accordingly, even if the output voltage from the battery 1 is a high voltage, it is possible to perform detection thereof in safety.

It should be understood that it is desirable for the switch 21 to be opened by the control signal from the microcomputer 3, if an anomaly has occurred during detection of the output voltage Vout of the battery 1, for example if it has been detected that Vout exceeds the maximum output voltage Vmax or the like. By doing this, it is possible to protect the voltage detection device when an anomaly occurs.

Now, with the voltage detection device of this embodiment, by performing correction of various types of error that may occur during the detection of the DC voltages V1 and V2 by the microcomputer 3, or by performing various failure diagnostics, it is arranged to be able accurately to obtain the output voltage Vout of the battery 1. These methods will be explained in the following.

Figure 4:
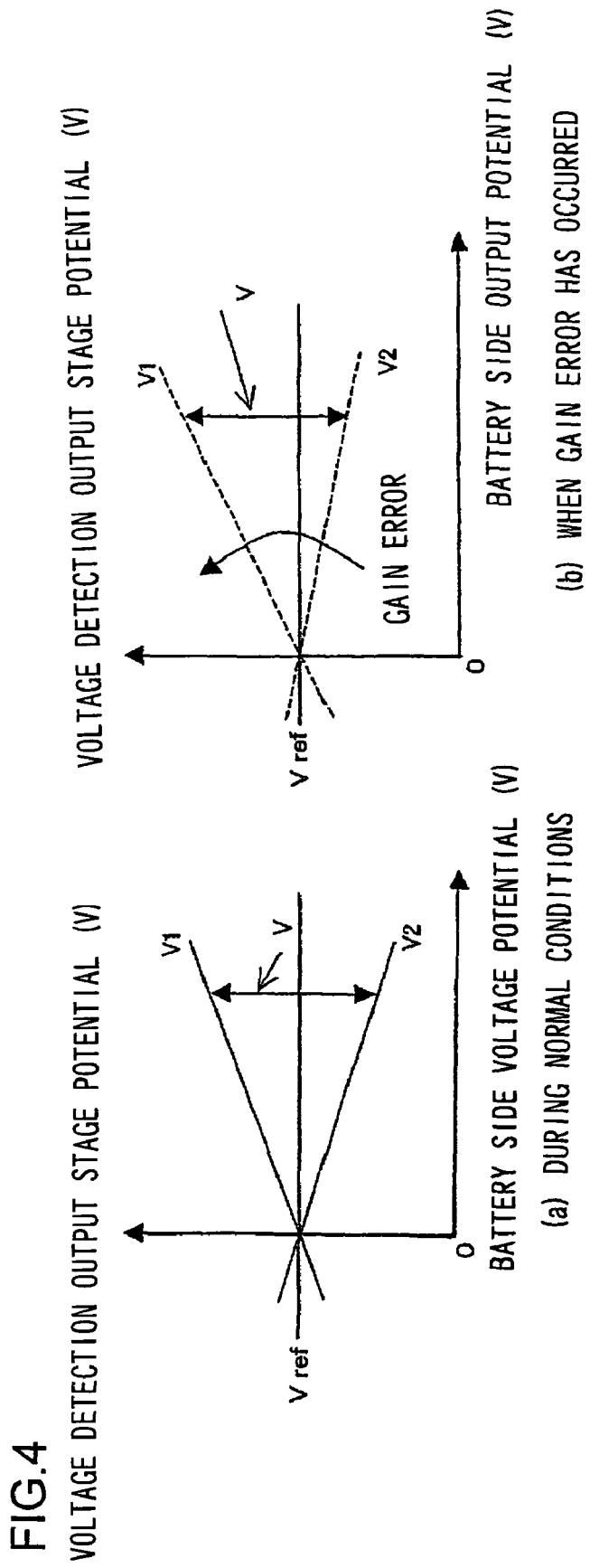
FIG. 4 is a figure for explanation of a method of correction, when a gain error has occurred.

FIG. 4 is a figure for explanation of the case when, during detection of V1 and V2 by the voltage detection unit 31, a gain error has occurred during conversion of a signal from analog to digital by the A/D ports. FIG. 4(a) shows the relationship during normal conditions between the battery side voltage potential and the DC voltages V1 and V2, in the absence of error. Since the relationship between Vout, V1 and V2 at this time is given by the Equations (5) and (6) described above, accordingly V1 and V2 are centered around the reference voltage Vref, and change upwards and downwards symmetrically as shown in FIG. 4(a).

FIG. 4(b) shows the relationship between the battery side voltage potential and the DC voltages V1 and V2 when a gain error has occurred at the A/D port of the microcomputer 3. If the gain error component at this time is denoted by Gerr, then the relationship between Vout, V1 and V2 is given by the following Equations (8) and (9):

$$V1=Vref+(½)Rt·Vout+Gerr·Vout \quad (8)$$

$$V2=Vref-(½)Rt·Vout+Gerr·Vout \quad (9)$$

The V1 and V2 that are given by the above Equations (8) and (9) change according to the battery side voltage potential, as for example shown in FIG. 4(b). In this manner, as compared with their waveforms during normal conditions as shown in FIG. 4(a), during the occurrence of a gain error, the slopes of V1 and V2 deviate from what they ought to be by just the gain error component Gerr.

It is possible to omit the gain error component Gerr when calculating the difference between both sides of Equations (8) and (9), so that Equation (7) is obtained. In other words, the voltage difference between V1 and V2 remains constant, irrespective of the magnitude of the gain error component. Accordingly, with the voltage detection device of this embodiment, it is possible to obtain Vout from Equation (7) even if a gain error has occurred, since this cancels out.

Figure 5:
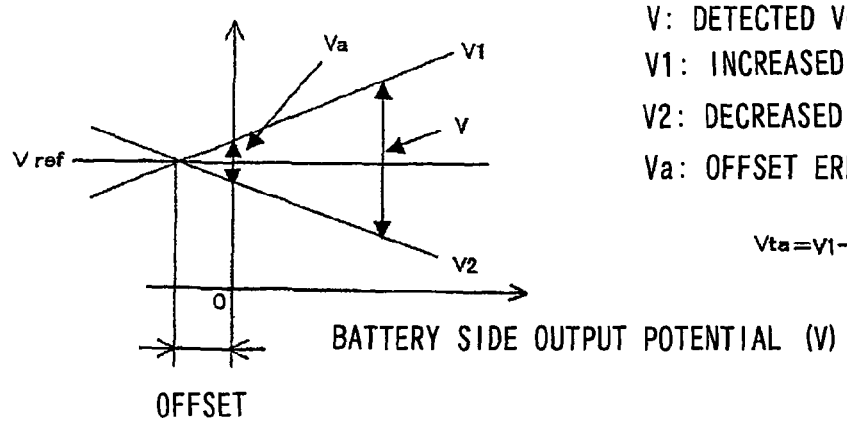
FIG. 5 is a figure for explanation of a method of correction if, when the output voltage Vout is 0, an offset error is included for which V1>V2.

Next, the method of correction if an offset error is included in the V1 and V2 that are outputted from the AC/DC converter 25 will be explained. It should be understood that an offset error differs from the gain error described above, and is an error that is caused due to the fact that, as shown in FIG. 5, the zero points of the V1 and V2 that are outputted from the AC/DC converter 25 are offset to the left and right in the figure (in other words, V1 and V2 are shifted in parallel). FIG. 5 shows the case in which, when the output voltage Vout is zero, V1>V2. In this type of case, if the value of V1−V2 when the output voltage Vout is zero is termed the offset error Va, then the result of the calculation of Equation (7) is in error by just this offset error Va. Thus, the offset detection unit 32 that is provided to the microcomputer 3 obtains the offset error Va based upon the voltage difference V between V1 and V2. The voltage detection unit 31 corrects the offset error and obtains Vout by using the value (termed Vta) resulting from subtracting the offset error Va that has been obtained by the offset detection unit 32 from the voltage difference V between V1 and V2.

In concrete terms, when it has been judged by the offset detection unit 32 that detects the offset error that V1>V2 when the output voltage Vout is zero, then the offset detection unit 32 calculates the offset error Va. At this time, instead of using Equation (7), the voltage detection unit 31 obtains Vout using Equation (10) described below:

$$Vout=(1/Rt)·(V1-V2-Va)$$

If V1−V2−Va=Vta, then this reduces to $$Vout=Vta/Rt \quad (10)$$

Figure 6:
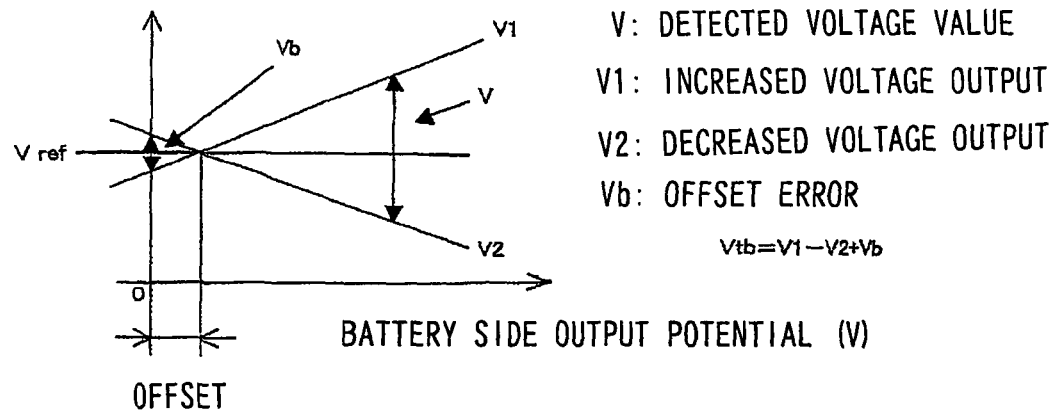
FIG. 6 is a figure for explanation of a method of correction if, when the output voltage Vout is 0, an offset error is included for which V1<V2.

FIG. 6 shows the case in which, when the output voltage Vout is zero, V1<V2. In this type of case, in a similar manner as explained with reference to FIG. 5, it is possible to correct the offset error and to obtain Vout by using the value (termed Vtb) resulting from adding the offset error Vb to the voltage difference V between V1 and V2. In concrete terms, when it has been judged by the offset detection unit 32 that detects the offset error that V1<V2 when the output voltage Vout is zero, then the offset detection unit 32 calculates the offset error Vb. At this time, instead of using Equation (7), the voltage detection unit 31 obtains Vout using Equation (11) described below:

$$Vout=(1/Rt)·(V1-V2+Vb)$$

If V1−V2+Vb=Vtb, then this reduces to $$Vout=Vtb/Rt \quad (11)$$

As has been explained above, it is possible to calculate the offset error Va or Vb from the difference between V1 and V2 when the output voltage Vout of the battery 1 is zero, and to calculate Vout by correcting this offset error. It should be understood that, when obtaining the offset error Va or Vb, even if the actual output voltage of the battery 1 is not zero, during detection of the offset by the offset detection unit 32, a command is transmitted from the offset detection unit 32 to the voltage detection unit 31 to open the switch 21 (i.e. to open the circuit). By a control signal being outputted to the switch 21 from the voltage detection unit 31 in response to this command, the switch 21 is opened and the connection state of the battery 1 is changed over to OFF. Due to this, the voltage that is applied to the primary coil 241 from the battery 1 becomes zero, so that it is possible to establish the same state as when the output voltage Vout of the battery 1 is zero.

Figure 9:
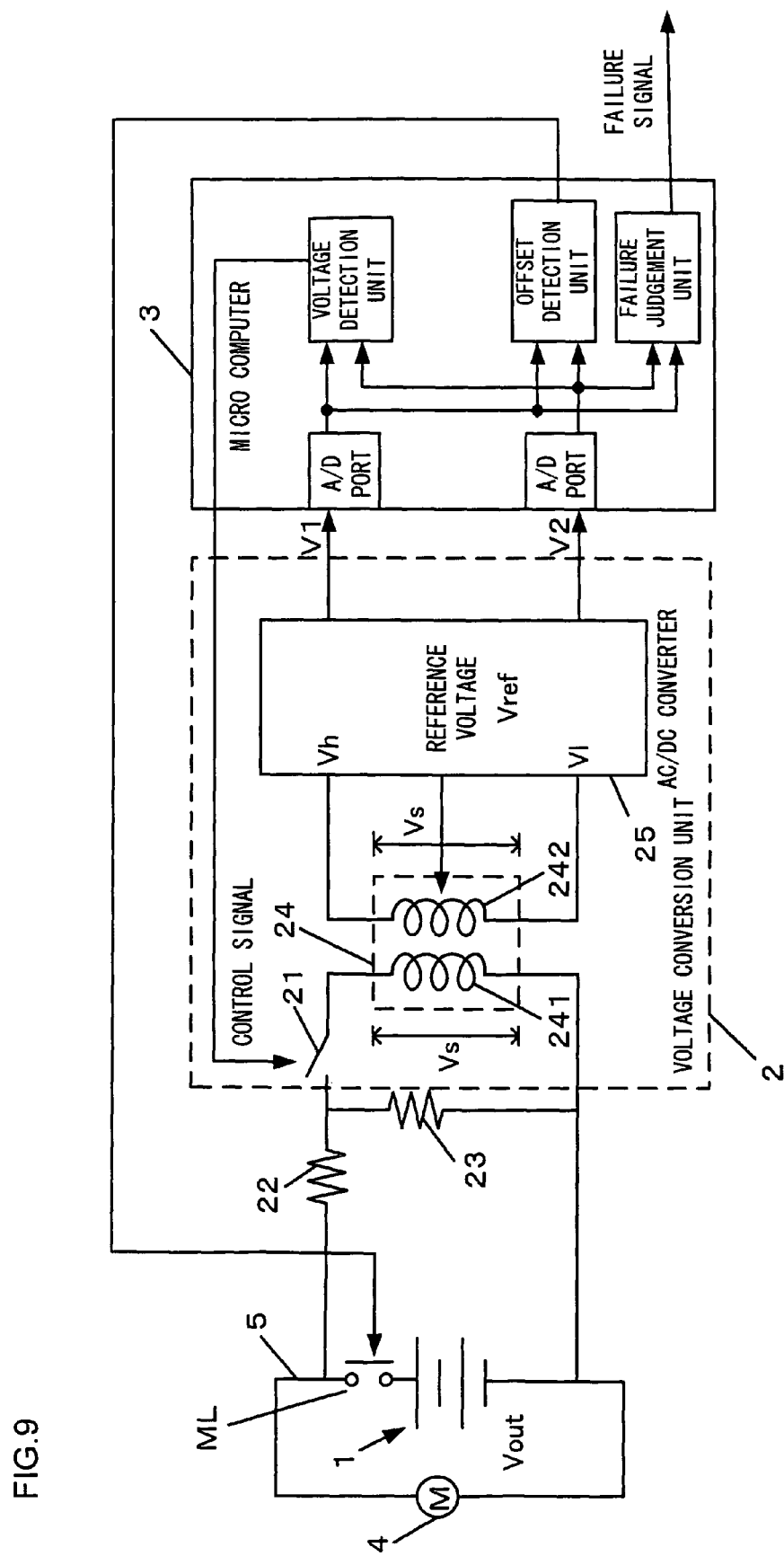
FIG. 9 is a figure showing a variant embodiment of this voltage detection device for a vehicle according to the first embodiment.

Or, as shown in the variant embodiment of FIG. 9, it is also possible to establish a state in which the voltage that is inputted from the battery 1 to the voltage change unit 2 is made to be zero, due to the fact that the battery 1 and the voltage detection device are electrically cut off from one another, and this state is equivalent to the state to when the output voltage Vout of the battery 1 is zero. In this case, the battery 1 and the voltage detection device are electrically cut off from one another due to the fact that a main relay ML, that is a switch for cutting out the battery 1 (the DC power supply) from the circuit, is opened by a control signal from the offset detection unit 32. It should be understood that such a main relay ML is conventionally provided to an electric automobile.

As described above, it is possible to make the voltage that is applied to the primary coil 241 be zero by cutting off the switch 21, or the main relay ML that is conventionally provided. By doing this it is possible to detect the offset error at any desired timing, irrespective of the output voltage of the battery 1 (i.e. of the state of the battery 1), and moreover without adding any special switch for detecting the offset error. Due to this, it is possible to calculate the offset error Va or Vb, irrespective of the state of the battery 1.

Figure 7:
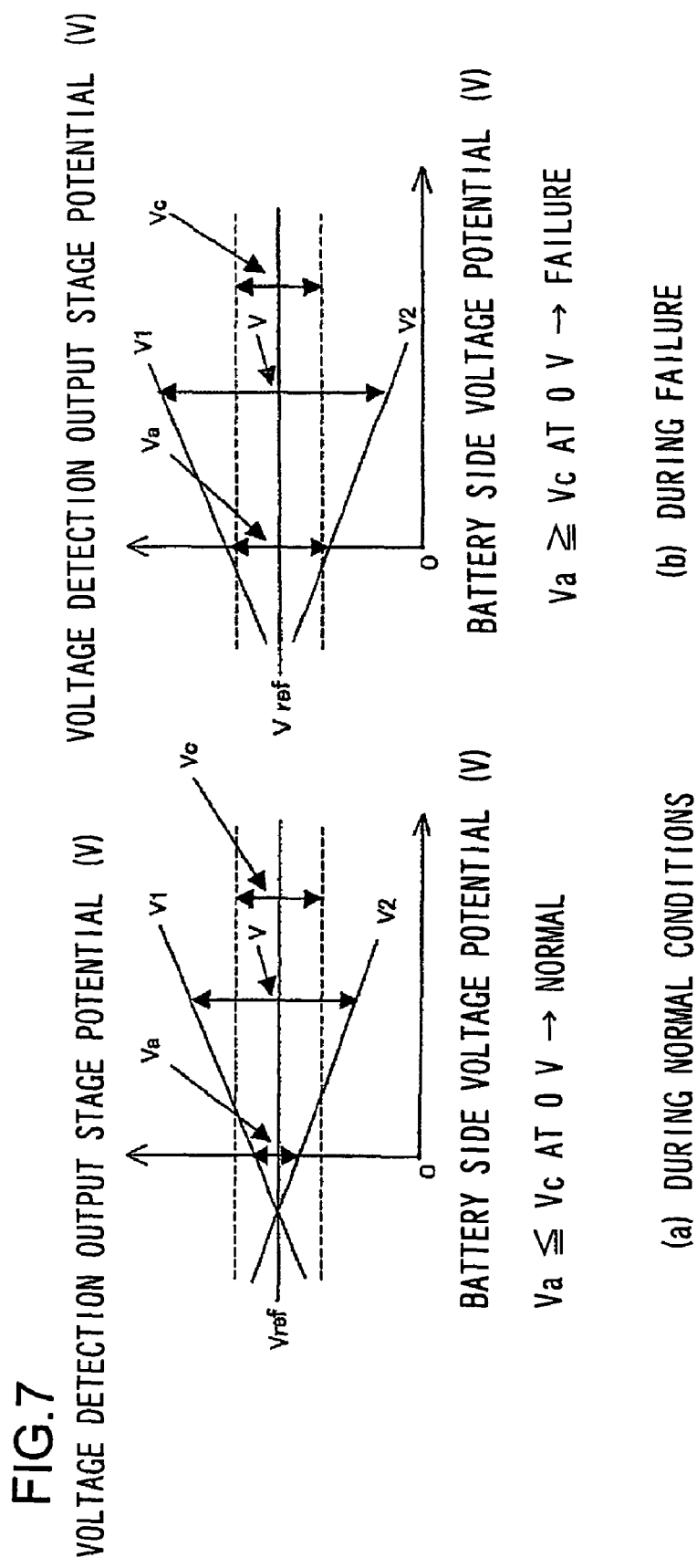
FIG. 7 is a figure for explanation of a method for failure diagnosis when an offset error is included.

Next, the failure diagnosis that is implemented for the voltage detection device of this embodiment will be explained. It should be understood that, in this embodiment, it will be supposed that the above described detection of the offset error by the offset detection unit 32 and the detection of the DC voltage by the voltage detection unit 31 are performed simultaneously (i.e. in parallel). FIG. 7 is a figure for explanation of the method for failure diagnosis when an offset error of the type explained in the above description is included in the results of detection of V1 and V2. In FIG. 7(a), there is shown the relationship between the battery side voltage potential and the DC voltages V1 and V2 during normal conditions. On the other hand, in FIG. 7(b), there is shown the relationship between the battery side voltage potential and the DC voltages V1 and V2 during a failure.

As shown in FIG. 1 and FIG. 9, the microcomputer 3 includes the failure judgment unit 33 that performs a judgment upon failure of the voltage detection device, based upon the values of V1 and V2 that are inputted. If, as shown in FIG. 7(a), V1>V2 when the output voltage Vout of the battery 1 is zero, then this failure judgment unit 33 judges that the voltage detection device is operating normally if the offset error Va is smaller than a predetermined threshold value Vc. In this case the battery output Vout is obtained by making a correction by the amount of the offset error Va in accordance with a method like that described above. However if the offset error Va is greater than or equal to the predetermined threshold value Vc, as shown in FIG. 7(b), then a judgment is made that the voltage detection device has failed and is not operating normally. In this case, the failure judgment unit 33 outputs a failure signal that indicates the fact that a failure is occurring upon a notification device such as, for example, an indicator or the like that is provided to the driver's seat of the vehicle, and performs notification of the occurrence of the failure and so on.

It should be understood that a certain offset may appear in V1 and V2, due to environmental changes of this type of voltage detection device such as temperature change or the like. Accordingly, the predetermined threshold value Vc is set to a value that is greater than or equal to the offset error Va when such an offset appears along with this type of environmental change. Due to this, if an offset error Va appears along with some environmental change (in other words if Va<Vc), the battery output Vout is obtained by performing a correction according to this amount of offset error Va; while, if an offset error has appeared along with failure of the voltage detection device (in other words if Va>Vc), then notification of the occurrence of a failure and the like is performed as described above. When detecting the offset by opening the switch 21 or the main relay ML, this type of failure may occur if, for example, a failure occurs in which the switch 21 or the main relay ML is not able to open perfectly (for example, a failure with its contact points welded).

It should be understood that, in the above description, only the case has been explained in which V1>V2 when the output voltage Vout of the battery 1 is zero. However, it is also possible to perform failure diagnosis by a similar method for the case in which V1<V2 when Vout is zero. In other words, if V1<V2 when the output voltage Vout is zero, then a judgment is made by the failure judgment unit 33 that the voltage detection device is operating normally, if the offset error Vb shown in FIG. 6 is smaller than a threshold value Vc. However, if the offset error Vb is greater than or equal to the threshold value Vc, then a judgment is made by the failure judgment unit 33 that the voltage detection device has failed and is not operating normally.

Figure 8:
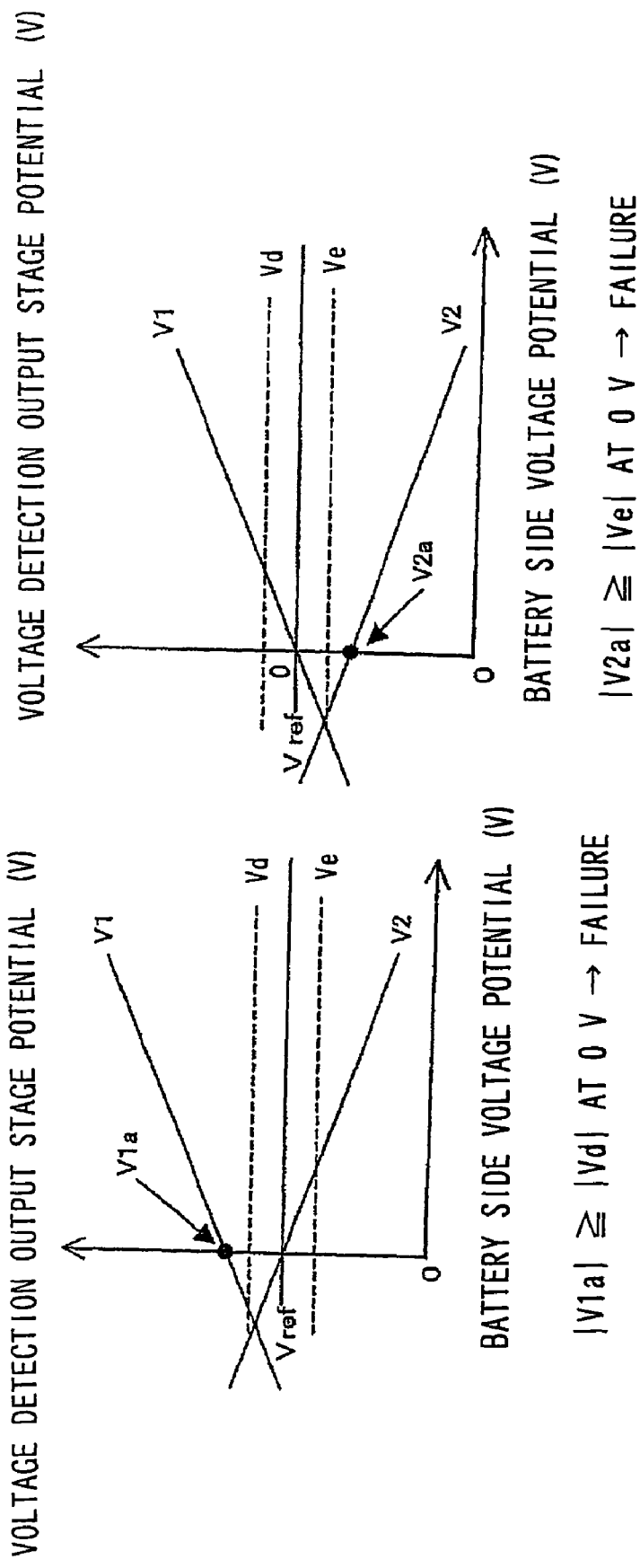
FIG. 8 is a figure for explanation of a method, in this first embodiment, for performing failure diagnosis based upon the result of measuring either V1 or V2.

Instead of performing failure diagnosis as explained above based upon the offset error that is obtained from the difference between V1 and V2 that is detected when the output voltage of the battery 1 is zero, it would also be possible to perform failure diagnosis based upon the result of measurement of either one of V1 and V2. This method will now be explained using FIG. 8. FIG. 8(a) is a figure for explanation of a method of performing failure diagnosis from the result of measurement of V1. As shown in this figure, if the result V1a of measurement of V1 when Vout is zero is greater than or equal to a predetermined threshold value Vd, then it is possible for a judgment to be made by the failure judgment unit 33 that the voltage detection device has failed.

In a similar manner to the case of V1 that has been explained in the description above, it is also possible to perform failure diagnosis from the result of measurement of V2. FIG. 8(b) is a figure for explanation of a method of performing failure diagnosis from the result of measurement of V2. As shown in this figure, if the result V2a of measurement of V2 when Vout is zero is less than or equal to a predetermined threshold value Ve, then it is possible for a judgment to be made by the failure judgment unit 33 that the voltage detection device has failed.

It should be understood that, in a similar manner to which described above, the predetermined threshold values Vd and Ve are set to values that are greater than or equal to the errors in V1 and V2 that are caused due to the offsets that accompany environmental changes. By doing this, notification of the occurrence of failure and soon is performed as described above when an offset error that accompanies failure of the voltage detection device has appeared (in other words when V1a>Vd or V2a<Ve). It should be understood that the type of failure of the voltage detection device is, for example, a failure of the AC/DC converter 25, or a failure in which a short circuit occurs in one portion of the secondary coil 242. And, as failure of the AC/DC converter 25, the type of failure is, for example, a failure such as one in which the Vref during the calculation of V1 by the AC/DC converter 25 becomes larger than the Vref that is actually applied to the center of the secondary coil 242, or a failure such as one in which the Vref during the calculation of V2 becomes smaller than the Vref that is actually applied to the center of the secondary coil 242.

The microcomputer 3 in the embodiment described above is adapted simultaneously to perform detection of the offset error with the offset detection unit 32, detection of the DC voltage with the voltage detection unit 31, and failure judgment with the failure judgment unit 33. However this is not limitative; it would also be acceptable to vary the details of the processing that is implemented simultaneously, according to the situation. For example, if the result of the judgment by the failure judgment unit 33 is that it is judged that a failure has occurred, then the detection of the offset error by the offset detection unit 32 and the detection of the DC voltage by the voltage detection unit 31 may be stopped.

According to the embodiment explained above, it is possible to obtain the following beneficial operational effects.

(1) The offset detection unit 32 of the microcomputer 3 calculates the offset error Va or Vb based upon the difference between V1 and V2 that is calculated when the output voltage of the battery 1 is zero, and calculates Vout based upon this offset error Va or Vb and the potential difference V between V1 and V2. Since this is done, even if an offset error occurs, it is possible to perform accurate voltage detection by correcting the offset error.

(2) The offset error Va or Vb is calculated by establishing a state that is equivalent to the state when the output voltage Vout of the battery 1 is zero, by making the voltage that is applied to the primary coil 241 from the battery 1 be zero due to the fact that the switch 21 or the main relay ML is turned OFF (i.e. is put to open circuit). Since this is done, it is possible to calculate the offset error Va or Vb at any desired timing, irrespective of the state of the battery 1.

(3) The failure judgment unit 33 judges that the voltage detection device has failed, if the offset error Va or Vb is greater than or equal to the predetermined threshold value Vc. Since this is done, it is possible to perform failure diagnosis of the voltage detection device in a simple manner.

(4) The failure judgment unit 33 judges that the voltage detection device has failed if, when the output voltage Vout of the battery 1 is zero, either the result V1a of measurement of V1 is greater than or equal to the predetermined threshold value Vd, or the result V2a of measurement of V2 is less than or equal to the predetermined threshold value Ve. Since this is done, it is possible to perform failure diagnosis of the voltage detection device in a simple manner.

Embodiment 2

Figure 10:
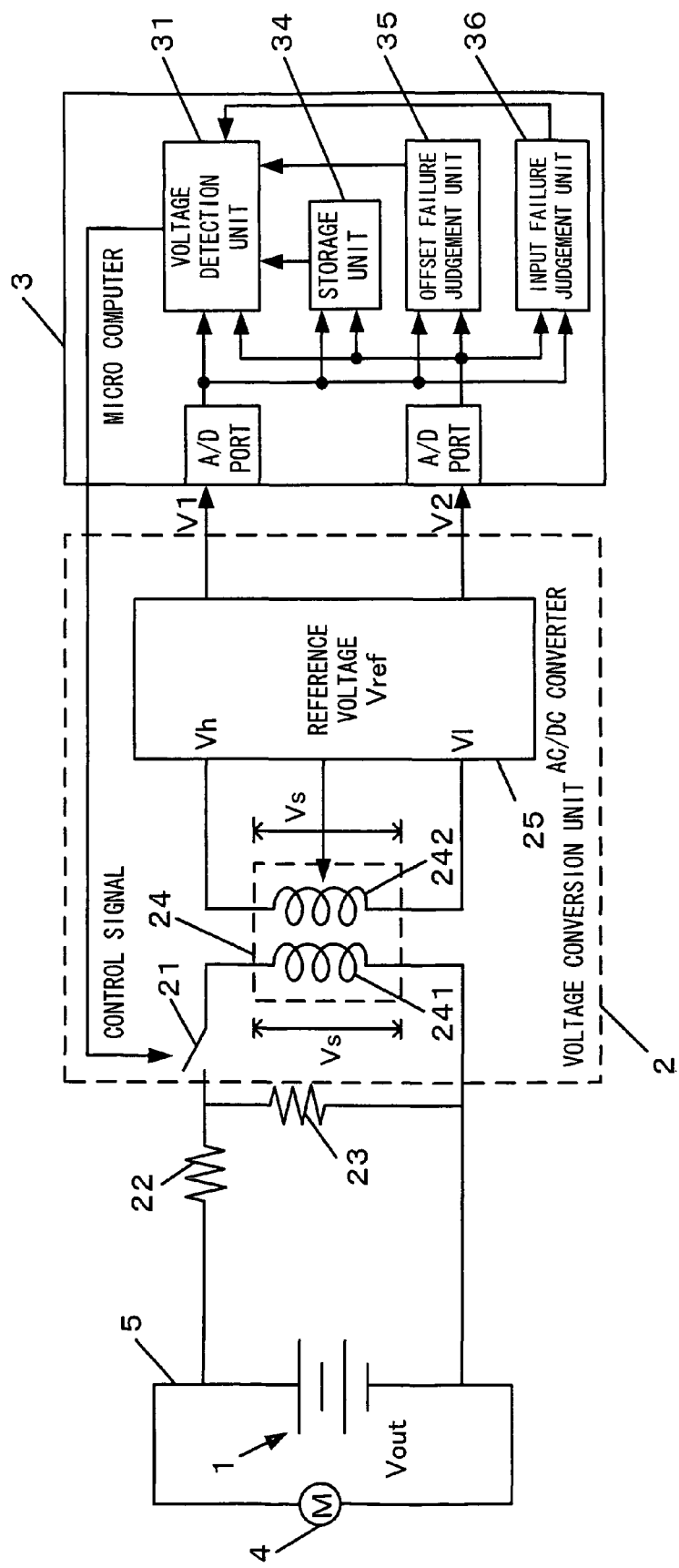
FIG. 10 is a block diagram showing a voltage detection device for a vehicle according to a second embodiment.
Figure 11:
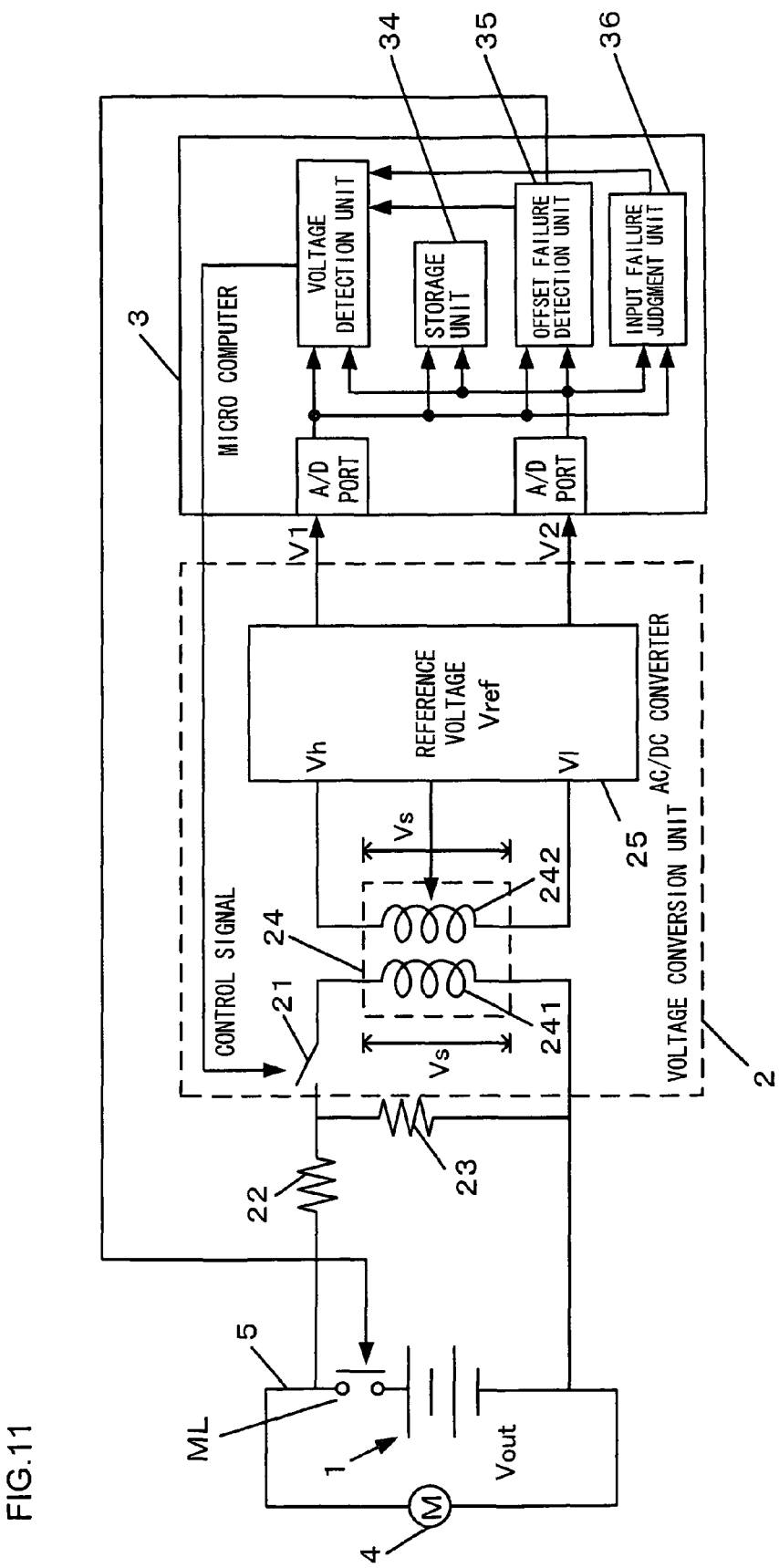
FIG. 11 is a figure showing a variant embodiment of this voltage detection device for a vehicle according to the second embodiment.

Next, a voltage detection device according to a second embodiment to which the present invention has been applied will be explained. FIGS. 10 and 11 are block diagrams of a voltage detection device for a vehicle according to the second embodiment. In this detection device for a vehicle, the A/D ports of the microcomputer 3 read in the DC voltages V1 and V2 as inputted analog signals, convert them from analog signals to digital signals, and output them. Due to this, the DC voltages V1 and V2 are detected by the microcomputer 3, in a similar manner to the case with the voltage detection device for a vehicle according to the first embodiment shown in FIGS. 1 and 9. This microcomputer 3 includes a voltage detection unit 31, just as in the case of FIGS. 1 and 9. Moreover, instead of the offset detection unit 32 and the failure judgment unit 33, there are included an offset failure judgment unit 35 and an input failure judgment unit 36, that make judgments as to failure of the voltage detection device based upon the DC voltages V1 and V2 that are inputted.

Next, the failure judgment that is implemented for the voltage detection device of this embodiment will be explained.

Figure 12:
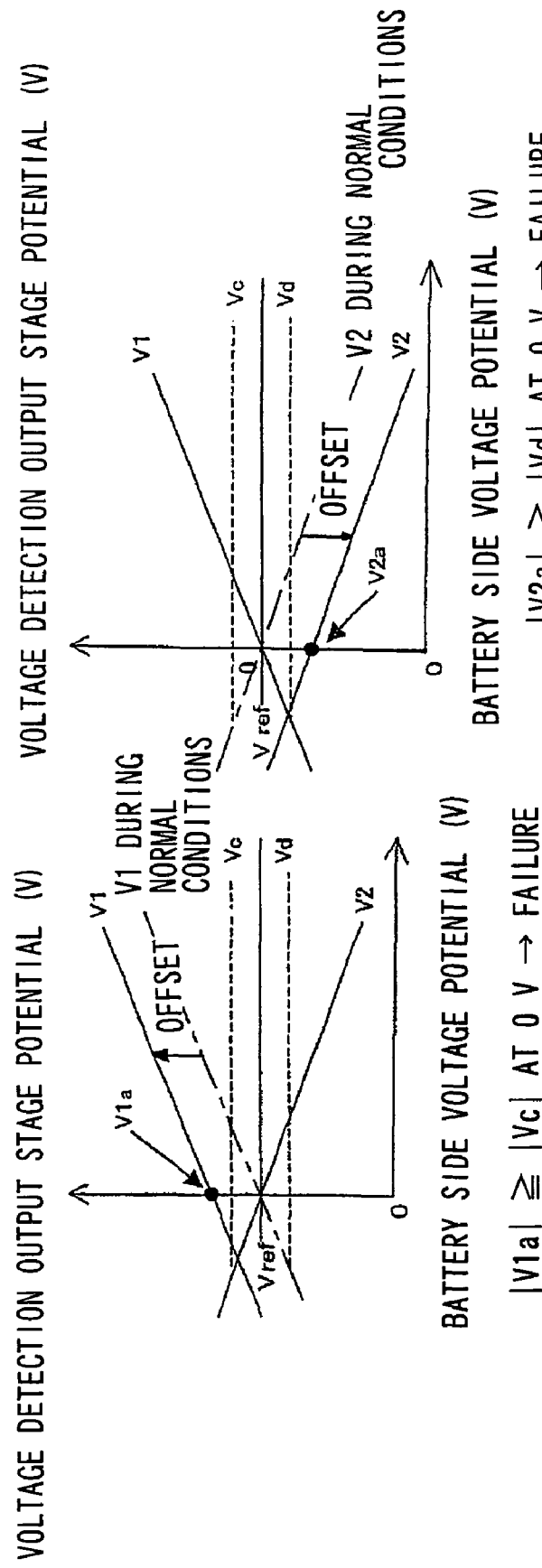
FIG. 12 is a figure for explanation of a method, in this second embodiment, for performing failure diagnosis based upon the result of measuring either V1 or V2.

As shown in FIGS. 10 and 11, the microcomputer 3 includes the offset failure judgment unit 35 that makes a judgment as to failure of the voltage detection device based upon V1 and V2 that are inputted. With the voltage detection device of the type shown in this embodiment, there is a possibility that failure of the AC/DC converter 25 may occur, and there is a possibility that failure may occur due to a short circuit in a portion of the secondary coil 242. In this case, V1 and V2 are offset, as shown in FIG. 12. It should be understood that a failure of the AC/DC converter 25 is such that, for example, the Vref by which the AC/DC converter 25 calculates V1 or V2 (in other words Vref in Equation (3) or (4)) is different from the Vref that is actually applied to the center of the secondary coil 242. The offset failure judgment unit 35 makes a judgment as to the occurrence of this type of failure.

FIG. 12 shows the relationship between the battery side voltage (in other words the output voltage Vout) and the voltage detection output stage potentials (in other words the DC voltages V1 and V2) when an offset failure like that described above has occurred. It should be understood that the Vref described in FIG. 12 means the proper (normal) value of Vref.

FIG. 12(*a*) shows an example of the relationship between the battery side voltage and the voltage detection output stage potentials when a failure has occurred in the voltage detection device. Here, an example is shown of a case in which a failure has taken place such that the Vref by which the AC/DC converter 25 calculates V1 (in other words Vref in Equation (3)) becomes greater than the Vref that is actually applied to the center of the secondary coil 242. If this type of failure has occurred, then V1 is offset upwards in the figure. Accordingly, as shown in this figure, the offset failure judgment unit 35 of the microcomputer 3 is able to judge that the AC/DC converter 25 has failed if the result V1a of measurement of V1 when Vout is zero is greater than or equal to a predetermined threshold value Vc.

FIG. 12(*b*) shows an example of the relationship between the battery side voltage and the voltage detection output state potentials when a failure other than that described above has occurred in the voltage detection device. Here, an example is shown of the occurrence of a failure such as the Vref during the calculation of V2 by the AC/DC converter 25 (in other words the Vref in Equation (4)) becoming smaller than the Vref that is actually applied to the center of the secondary coil 242, or of a failure such as a short circuit being occurred at the voltage side lower than the center of the secondary coil 242. If this type of failure has occurred, then V2 is offset downwards in the figure. Accordingly, as shown in this figure, the offset failure judgment unit 35 of the microcomputer 3 is able to judge that the voltage detection device has failed, if the result V2a of measurement of V2 when Vout is zero is less than or equal to a predetermined threshold value Vd.

It should be understood that a certain offset error may appear in V1 and V2, due to environmental changes of this type of voltage detection device such as temperature change or the like. Due to this, the predetermined threshold values Vc and Vd are set to values that are greater than or equal to the errors in V1 and V2 that are caused by offset along with environmental changes, in a similar manner to which described above.

In this manner, the offset failure judgment unit 35 of the microcomputer 3 detects failure of the voltage conversion unit 2, and outputs a failure signal a to the voltage detection unit 31 if it has decided that a failure has occurred. And, upon receipt of the failure signal a, the voltage detection unit 31 prohibits the detection operation for DC voltage (in other words, the calculation of the DC voltage). It should be understood that it would also be acceptable to notify the occurrence of the failure by outputting the failure signal a from the offset failure judgment unit 35 to an external notification device such as a display or the like.

As has been explained above, the offset failure judgment unit 35 detects failure of the voltage conversion unit 2 from V1a and V2a, that are the values of V1 and V2 when the output voltage Vout of the battery 1 is zero. It should be understood that, during this offset failure judgment by the offset failure judgment unit 35, even if the actual output voltage of the battery 1 is not zero, a command is transmitted from the offset failure judgment unit 35 to the voltage detection unit 31 to open the switch 21 (i.e. to open the circuit). In response to this command, the voltage that is applied from the battery 1 to the primary coil 241 is brought to zero by opening the switch 21 according to the control signal from the voltage detection unit 31, and thus changing over the connection state of the battery 1 to OFF. Due to this, a state can be established that is equivalent to the state when the output voltage Vout from the battery 1 is zero.

Or, as shown in FIG. 11, by electrically disconnecting the battery 1 and the voltage detection device from one another, and by thus making the voltage that is inputted from the battery 1 to the voltage conversion unit 2 be zero, it is also possible to establish a state that is equivalent to when the output voltage of the battery 1 is zero. In this case the battery 1 and the voltage detection device are electrically cut off from one another due to the fact that a main relay ML, that is a switch for cutting out the battery 1 (the DC power supply) from the circuit, is opened by a control signal from the offset failure judgment unit 35. It should be understood that such a main relay ML is normally provided to an electric automobile.

As described above, it is possible to make the voltage that is applied to the primary coil 241 be zero by cutting off the switch 21, or the main relay ML that is conventionally provided. By doing this it is possible to perform failure judgment at any desired timing, irrespective of the output voltage of the battery 1 (i.e. of the state of the battery 1), and moreover without adding any special switch for performing the offset failure judgment. Due to this, it is possible for the offset failure judgment unit 35 to perform failure judgment, irrespective of the state of the battery 1.

Furthermore, with the voltage detection device of this embodiment, as shown in FIGS. 10 and 11, the microcomputer 3 includes a storage unit that stores the inputted V1 and V2, and an input failure judgment unit 36 that makes a judgment as to failure of the voltage detection device as will be described hereinafter, based upon the inputted V1 and V2.

With a voltage detection device like the one of this embodiment, for example, there is a possibility of the occurrence of a failure in which the AC/DC converter 25 becomes unable to output either V1 or V2, of the occurrence of a failure in which one or the other of the two communication lines for transmitting V1 or V2 from the AC/DC converter 25 to the microcomputer 3 becomes broken, or of the occurrence of a failure in which the A/D ports of the microcomputer 3 become unable to read in either V1 or V2. If it is not possible to detect at least one of V1 and V2 (in other words if either V1 or V2 inputted via the A/D ports is not actually inputted), then the input failure judgment unit 36 judges that this type of failure has occurred, and accordingly outputs a failure signal β to the voltage detection unit 31 and to the storage unit 34.

Each time that V1 and V2 are inputted, the storage unit 34 updates and stores the stored V1 and V2. However, if the failure signal β is inputted, the updating of V1 and V2 is stopped, with their values directly before the failure signal is inputted remaining stored just as they are. In other words, if the failure signal β has been inputted, then the storage unit 34 keeps storing the values of V1 and V2 before the failure signal β was inputted.

Upon receipt of the failure signal β from the input failure judgment unit 33, the voltage detection unit 31 reads out the V1 and V2 that are stored in the storage unit 34, in other words the values of V1 and V2 before a judgment was made via the failure signal β. And the DC voltage is detected using the V1 and V2 that have thus been read out, and the value of either one that can be detected of the V1 and V2 that are inputted from the AC/DC converter 25.

Figure 13:
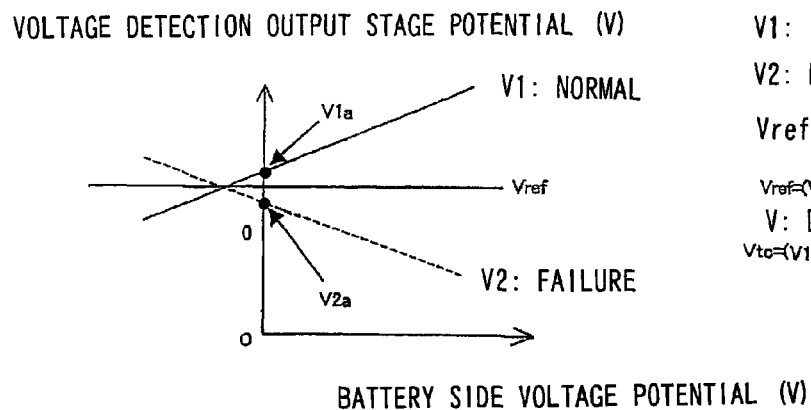
FIG. 13 is a figure for explanation of a method for obtaining the battery output voltage Vout, if it has become impossible to detect V2.

FIG. 13 shows the situation when it has become impossible to detect V2. If, in this manner, it has become impossible to detect V2, then the voltage detection unit 31 calculates the difference between a value that is intermediate between the values of V1 and V2 before failure, that are stored in the storage unit 34, and the value of V1 that can be detected. And it obtains twice the value of this differential that has been calculated (termed Vtc); and uses this Vtc in Equation (7) instead of V. In other words, upon receipt of the failure signal β, the voltage detection unit 31 calculates the value intermediate between V1 and V2 before failure as being Vref. And then it takes Vtc, that is a voltage value twice the difference between this Vref, that has been calculated, and V1, that can be detected, as being V, that is the difference between V1 and V2, and thereby calculates the DC voltage Vout.

It should be understood that, if it has become impossible to detect V1, then, in a similar manner to the case of V2 explained above, it is possible to calculate Vout by taking a value intermediate between the values of V1 and V2 before failure as Vref, and by using, instead of V in Equation (7), twice the voltage value of the difference between this value Vref and the value of V2 that can be detected.

According to the second embodiment explained above, the following beneficial operational effects may be obtained.

(1) If at least one of V1 and V2 cannot be detected, it is decided that the voltage detection device has failed. Accordingly it is possible to perform failure diagnosis of the voltage detection device in a simple manner.

(2) The values of V1 and V2 that are detected when the output voltage Vout of the battery 1 is zero are both stored. And, if a failure has occurred in which it is not possible to detect one or the other of V1 or V2, then the output voltage Vout of the battery 1 is calculated based upon the value Vtc that is obtained by doubling the difference between that one of V1 and V2 that can be detected and a value that is intermediate between the stored values of V1 and V2 before failure. Since this is done, accordingly it is still possible to perform voltage detection, even if it is not possible to detect one or the other of V1 or V2.

(3) The calculation of the output voltage Vout is not performed if, when the output voltage of the battery 1 is zero, either the result V1a of measurement of V1 is greater than or equal to the predetermined threshold value Vc, or the result V2a of measurement of V2 is less than or equal to the predetermined threshold value Vd, or both. Accordingly, it is possible to prevent the calculation of an output voltage that is greatly different from the actual output voltage of the battery, due to calculation of the output voltage Vout based upon either V1 or V2 in which a large error is being generated.

It should be understood that, although in the embodiments described above the output voltage of the battery 1 was taken as the subject for detection, it would also be acceptable to arrange for the voltage that is the subject for detection to be other than the battery voltage. For example, it would also be possible for a DC voltage of any type to be taken as being the subject for detection, such as the output voltage from an assembled battery that is made up as a combination of a plurality of batteries, or from a capacitor or the like, or a DC voltage at some spot upon a circuit or the like. It would also be acceptable to arrange for any object to be the subject of voltage detection, provided that it is one that outputs a DC voltage. Moreover, it would also be acceptable to apply the present invention to an electrical current detection device that detects a DC current by providing a resistor in a DC circuit to which a DC power supply is connected and thus converting the DC current into a DC voltage, and by detecting the DC voltage that has thus been converted.

The embodiments described above and the various types of variant embodiment are only given by way of example; the present invention is not to be considered as being limited by the details thereof, provided that its distinguishing features are not abandoned.

In the embodiments described above, a voltage conversion means is implemented by the voltage conversion unit 2, and a voltage calculation means is implemented by the voltage detection unit 31 of the microcomputer 3. Moreover, it is arranged for a DC/AC conversion means and a connection changeover means to be implemented by the switch 21, for a transformer means to be implemented by the transformer 24, and for a reference voltage application means and an AC/DC conversion means to be implemented by the AC/DC converter 25. Furthermore in the first embodiment it is arranged, respectively, for an error detection means to be implemented by the offset detection unit 32 of the microcomputer 3, and for a failure judgment means to be implemented by the failure judgment unit 33 of the microcomputer 3; and in the second embodiment it is arranged, respectively, for a first failure judgment means to be implemented by the input failure judgment unit 36 of the microcomputer 3, for a second failure judgment means to be implemented by the offset failure judgment unit 35 of the microcomputer 3, and for a storage means to be implemented by the storage unit 34 of the microcomputer 3. However, the explanation above is only one example, and, when interpreting this invention, the correspondence relationship between the items described in the embodiments above and the items described in the scope of the claims is not to be considered as being constrained thereby in any way.

It should be understood that it would also be acceptable to replace, respectively, the voltage conversion means by a voltage conversion unit, the error detection means by an error detection unit, the voltage calculation means by a voltage calculation unit, and the failure judgment means by a failure judgment unit. Moreover, it would also be possible to replace, respectively, the DC/AC conversion means by a DC/AC conversion unit, the transformer means by a transformer unit, the reference voltage application means by a reference voltage application unit, the AC/DC conversion means by an AC/DC conversion unit, and the connection changeover means by a connection changeover unit. Yet further, it would also be possible to replace, respectively, the first failure judgment means by a first failure judgment unit, the storage means by a storage unit, and the second failure judgment means by a second failure judgment unit.

The following disclosures are hereby incorporated by reference:

Japanese Patent Application 2006-4834 (filed on Jan. 12, 2006) and Japanese Patent Application 2006-336985 (filed on Dec. 14, 2006).

The invention claimed is:

1. A voltage detection device that is connected to a DC circuit to which a DC voltage is applied and that detects the DC voltage applied to the DC circuit, comprising:
    a voltage conversion means for outputting a first voltage that increases as the DC voltage increases and a second voltage that decreases as the DC voltage increases;
    an error detection means for detecting an error for the first voltage and the second voltage based upon the first voltage and the second voltage when the DC voltage is 0; and
    a voltage calculation means for correcting a difference between the first voltage and the second voltage outputted by the voltage conversion means based upon the error detected by the error detection means and calculating the DC voltage based upon the corrected difference between the first voltage and the second voltage.

2. A voltage detection device according to claim 1, wherein the error detection means detects the difference between the first voltage and the second voltage when the DC voltage is zero as the error for the first voltage and the second voltage.

3. A voltage detection device that is connected to a DC circuit to which a DC voltage is applied and that detects the DC voltage applied to the DC circuit, comprising:
    a voltage conversion means for outputting a first voltage that increases as the DC voltage increases and a second voltage that decreases as the output voltage increases;
    a voltage calculation means for calculating the DC voltage based upon a difference between the first voltage and the second voltage outputted by the voltage conversion means; and
    a failure judgment means for judging failure based upon at least one of the first voltage and the second voltage when the DC voltage is zero.

4. A voltage detection device according to claim 1 or claim 2, further comprising a failure judgment means for judging failure based upon at least one of the first voltage and the second voltage when the DC voltage is zero.

5. A voltage detection device according to claim 4, wherein the failure judgment means judges that failure has occurred if, when the DC voltage is zero, the difference between the first voltage and the second voltage is greater than or equal to a predetermined difference.

6. A voltage detection device according to claim 4, wherein the failure judgment means judges that failure has occurred if, when the DC voltage is zero, the first voltage is greater than or equal to a predetermined value, or the second voltage is less than or equal to a predetermined value.

7. A voltage detection device according to any one of claims 1 through 6, wherein the voltage conversion means comprises:
    a DC/AC conversion means for oscillating the DC voltage at a predetermined period and converting the DC voltage to an AC voltage;
    a transformer means for applying all or a part of an output voltage converted to the AC voltage by the DC/AC conversion means to a primary coil and transmitting it to a secondary coil at a predetermined transmission ratio Rt;
    a reference voltage application means for applying a predetermined reference voltage Vref to a point that is positioned at an approximate center between two ends of the secondary coil; and
    an AC/DC conversion means for detecting AC voltages Vh and Vl at the two ends of the secondary coil and converting them to the first voltage and to the second voltage respectively.

8. A voltage detection device according to any one of claims 1 through 7, wherein the DC voltage is a voltage that is applied to the DC circuit from a DC power supply, further comprising:
    a connection changeover means for changing over the DC power supply and the DC circuit to a connection state or a cut off state; and wherein:
    a state in which the DC voltage is zero is a state in which the DC power supply and the DC circuit are put into the cut off state by the connection changeover means.

9. A voltage detection device according to claim 7, wherein:
    the DC/AC conversion means oscillates the DC voltage at a predetermined period and converts the DC voltage to the AC voltage by opening and closing a switch that is connected between the DC circuit and the primary coil at a predetermined period; and a state in which the DC voltage is zero is a state in which the switch is open circuit.

10. A voltage detection method for detecting a DC voltage that is applied to a DC circuit, comprising:
   outputting a first voltage that increases as the DC voltage increases and a second voltage that decreases as the DC voltage increases;
   detecting an error for the first voltage and the second voltage based upon the first voltage and the second voltage when the DC voltage is 0;
   correcting a difference between the first voltage and the second voltage based upon the detected error; and
   calculating the DC voltage based upon the corrected difference between the first voltage and the second voltage.

11. A voltage detection method according to claim 10, wherein the difference between the first voltage and the second voltage when the DC voltage is zero is detected as the error for the first voltage and the second voltage.

12. A voltage detection method for detecting a DC voltage that is applied to a DC circuit, comprising:
   outputting a first voltage that increases as the DC voltage increases and a second voltage that decreases as the DC voltage increases;
   calculating the DC voltage based upon a difference between the first outputted voltage and the second outputted voltage; and
   judging failure based upon at least one of the first voltage and the second voltage when the DC voltage is zero.

13. A voltage detection device according to claim 3, wherein the voltage conversion unit comprises:
   a DC/AC conversion unit that oscillates the DC voltage at a predetermined period and converts the DC voltage to an AC voltage;
   a transformer unit that applies all or a part of an output voltage converted to the AC voltage by the DC/AC conversion unit to a primary coil and transmits it to a secondary coil at a predetermined transmission ratio Rt;
   a reference voltage application unit that applies a predetermined reference voltage Vref to a point that is positioned at an approximate center between two ends of the secondary coil; and
   an AC/DC conversion unit that detects AC voltages Vh and Vl at the two ends of the secondary coil and converts them to the first voltage and to the second voltage respectively.

14. A voltage detection device according to claim 3, wherein the DC voltage is a voltage that is applied to the DC circuit from a DC power supply, further comprising:
   a connection changeover unit that changes over the DC power supply and the DC circuit to a connection state or a cut off state; and wherein:
   a state in which the DC voltage is zero is a state in which the DC power supply and the DC circuit are put into the cut off state by the connection changeover unit.

* * * * *